(12) United States Patent
Negishi et al.

(10) Patent No.: US 9,196,369 B2
(45) Date of Patent: Nov. 24, 2015

(54) COMMUNICATION DEVICE AND COMMUNICATION METHOD

(75) Inventors: Masaki Negishi, Tokyo (JP); Tetsuro Akaida, Kanagawa (JP)

(73) Assignee: Sony Corporation (JP)

( * ) Notice: Subject to any disclaimer, the term of this patent is extended or adjusted under 35 U.S.C. 154(b) by 408 days.

(21) Appl. No.: 13/151,586

(22) Filed: Jun. 2, 2011

(65) Prior Publication Data

US 2011/0304436 A1 Dec. 15, 2011

(30) Foreign Application Priority Data

Jun. 10, 2010 (JP) .................................. P2010-133181

(51) Int. Cl.
*H04Q 5/22* (2006.01)
*G11C 16/22* (2006.01)
*G06K 7/00* (2006.01)

(52) U.S. Cl.
CPC ............ *G11C 16/225* (2013.01); *G06K 7/0008* (2013.01)

(58) Field of Classification Search
CPC .................................................. G06F 12/0238
USPC .................. 711/101, 102, 103; 709/212, 213; 340/10.1, 10.51
See application file for complete search history.

(56) References Cited

U.S. PATENT DOCUMENTS

| | | | |
|---|---|---|---|
| 5,638,535 A * | 6/1997 | Rosenthal et al. ............ | 711/165 |
| 6,363,455 B2 * | 3/2002 | Kusakabe et al. ............. | 711/103 |
| 7,571,276 B2 * | 8/2009 | Cho et al. ....................... | 711/103 |
| 7,600,085 B2 * | 10/2009 | Yokota et al. .................. | 711/159 |
| 2004/0039882 A1 * | 2/2004 | Kusakabe et al. ............. | 711/147 |
| 2004/0221092 A1 * | 11/2004 | Lee ................................ | 711/103 |
| 2007/0002817 A1 * | 1/2007 | Horisawa ....................... | 370/338 |
| 2007/0150649 A1 * | 6/2007 | Asari et al. .................... | 711/103 |
| 2007/0150694 A1 * | 6/2007 | Chang et al. .................. | 711/202 |
| 2008/0034153 A1 * | 2/2008 | Lee et al. ....................... | 711/103 |
| 2008/0086509 A1 * | 4/2008 | Wallace ...................... | 707/104.1 |

(Continued)

FOREIGN PATENT DOCUMENTS

| | | |
|---|---|---|
| JP | H11-85629 A | 3/1999 |
| JP | 2005078489 A | 3/2005 |

(Continued)

OTHER PUBLICATIONS

Japanese Office Action for JP Application No. 2014008490, dated Dec. 11, 2014.

*Primary Examiner* — Hai Phan
*Assistant Examiner* — Zhen Y Wu
(74) *Attorney, Agent, or Firm* — Lerner, David, Littenberg, Krumholz & Mentlik, LLP

(57) ABSTRACT

A communication device includes: a communication unit configured to perform proximity communication with a reader/writer; and a control unit configured to control writing of data as to nonvolatile memory in accordance with a command from the reader/writer; with the control unit writing data in a buffer unit that serves as a buffer to buffer data to be written, in accordance with a command from the reader/writer, writing the unit number of an object unit that is a unit to be written with data as the unit number of the buffer unit, and taking the object unit as a new buffer unit, thereby performing writing of data in the object unit; and with the control unit being activated by an RF signal being received from the reader/writer, and erasing all of the pages of the buffer unit during activation processing to be performed before receiving a command from the reader/writer.

15 Claims, 9 Drawing Sheets

(56) References Cited

U.S. PATENT DOCUMENTS

| | | | |
|---|---|---|---|
| 2008/0086589 A1* | 4/2008 | Urabe | 711/103 |
| 2008/0115541 A1* | 5/2008 | Aldridge | 68/212 |
| 2008/0186139 A1* | 8/2008 | Butler et al. | 340/10.1 |
| 2008/0189478 A1* | 8/2008 | Chae et al. | 711/103 |
| 2008/0195797 A1* | 8/2008 | Sherman et al. | 711/103 |
| 2008/0256352 A1* | 10/2008 | Chow et al. | 713/2 |
| 2008/0301357 A1* | 12/2008 | La Rosa et al. | 711/103 |
| 2009/0119450 A1* | 5/2009 | Saeki et al. | 711/103 |
| 2009/0150599 A1* | 6/2009 | Bennett | 711/103 |
| 2009/0201735 A1* | 8/2009 | Park | 365/185.12 |
| 2009/0265508 A1* | 10/2009 | Bennett et al. | 711/103 |
| 2009/0271568 A1* | 10/2009 | Kwon | 711/103 |
| 2009/0292862 A1* | 11/2009 | Kitahara | 711/103 |
| 2010/0023672 A1* | 1/2010 | Gorobets et al. | 711/103 |
| 2010/0034024 A1* | 2/2010 | Mochizuki et al. | 365/185.18 |
| 2010/0049908 A1* | 2/2010 | Gonzalez et al. | 711/103 |
| 2010/0088557 A1* | 4/2010 | Weingarten et al. | 714/704 |
| 2010/0095051 A1* | 4/2010 | Chen et al. | 711/103 |
| 2010/0095054 A1* | 4/2010 | Terasaki | 711/103 |
| 2010/0122016 A1* | 5/2010 | Marotta et al. | 711/103 |

FOREIGN PATENT DOCUMENTS

| | | |
|---|---|---|
| JP | 2005235028 A | 9/2005 |
| JP | 3702923 B2 | 10/2005 |
| JP | 2008040594 A | 2/2008 |
| JP | 2010049303 A | 3/2010 |

\* cited by examiner

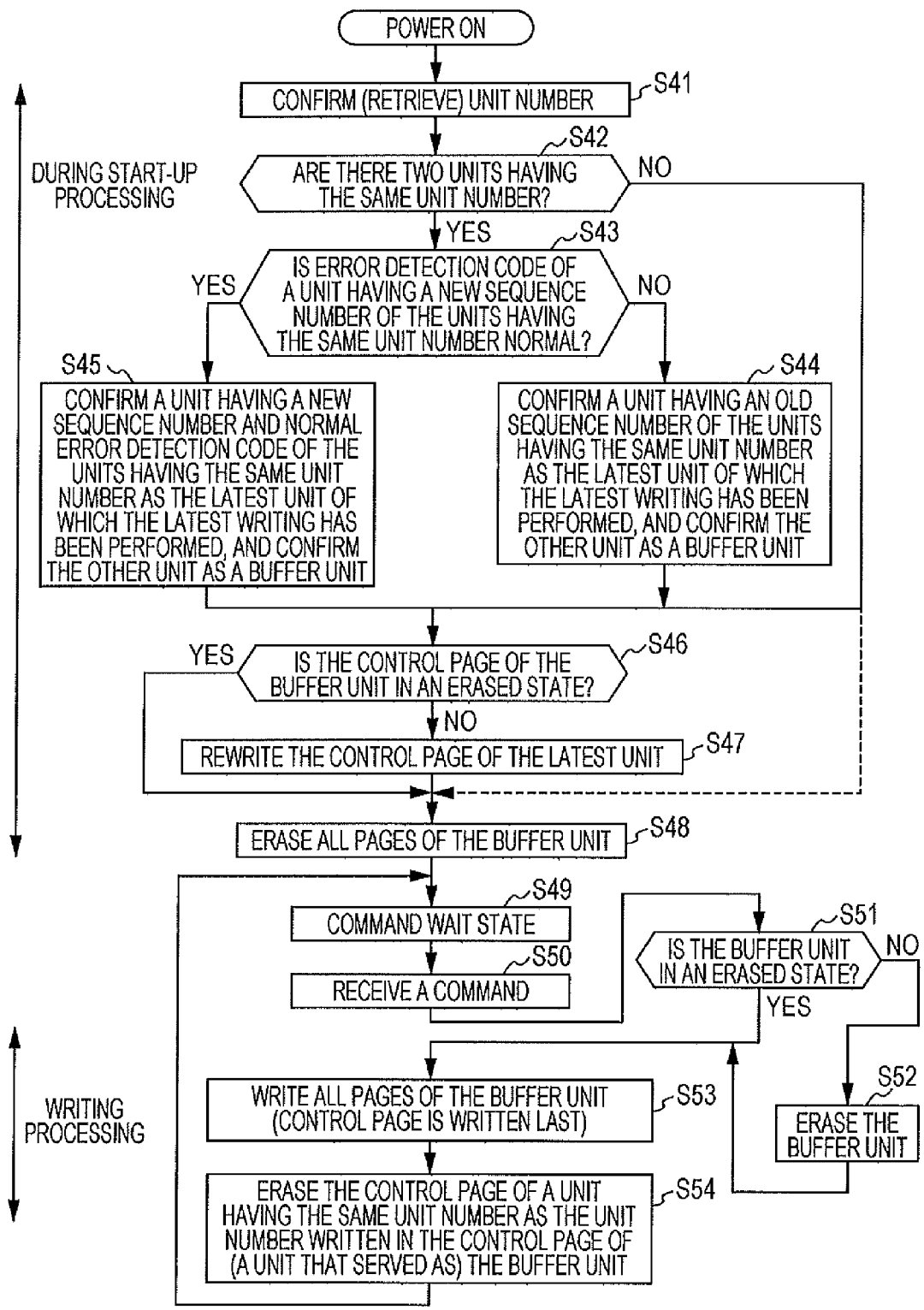

COMMUNICATION DEVICE AND COMMUNICATION METHOD

CROSS-REFERENCE TO RELATED APPLICATION

The present application claims priority from Japanese Patent Application No. JP 2010-133181 filed in the Japanese Patent Office on Jun. 10, 2010, the entire content of which is incorporated herein by reference.

BACKGROUND OF THE INVENTION

1. Field of the Invention

The present invention relates to a communication device and a communication method, and specifically relates to a communication device and a communication method, whereby retention property can be maintained, and also writing processing time used for writing can be shortened, regarding nonvolatile memory which a wireless tag houses, for example, such as an IC card or IC chip or the like which performs proximity communication with a reader/writer.

2. Description of the Related Art

In recent years, proximity communication for performing wireless communication by noncontact at short range using IC (Integrated Circuit) cards and the like, has been used for, for example, electronic commuter passes, electronic money, and so forth, and also cellular phones having electronic commuter pass functions, and electronic money functions that take advantage of proximity communication, have come into widespread use.

Proximity communication has been standardized as, for example, ISO/IEC 14443, ISO/IEC 18092 (hereafter, also referred to as NFC (Near Field Communication)), and so forth. Here, of communication devices for performing proximity communication such as communication conforming to the NFC standard, or the like, communication devices such as IC cards, IC chips, and so forth for performing proximity communication with a reader/writer which outputs RF (Radio Frequency) signals, in response to signals from the reader/writer, are also referred to as wireless tags.

Wireless tags provide various types of services by housing nonvolatile memory such as EEPROM (Electrically Erasable Programmable Read Only Memory) or the like, and performing reading/writing of data to be exchanged with a reader/writer as to the nonvolatile memory by proximity communication, for example.

Note that, of wireless tags, there are batteryless wireless tags which operate with RF signals output by a reader/writer as the power source thereof. Batteryless wireless tags operate with RF signals output by a reader/writer as the power source thereof, and accordingly fail to obtain sufficient power at the time of being separated from a reader/writer. Therefore, for example, with a wireless tag, upon the wireless tag being separated from a reader/writer while access to built-in nonvolatile memory is performed, the wireless tag fails to operate, and memory corruption may occur, i.e., inconsistency may occur in data stored in the nonvolatile memory.

Also, with a wireless tag having battery (e.g., an IC chip housed in a cellular phone) as well, memory corruption may occur in the event that data to be written in nonvolatile memory is prevented from being received from a reader/writer by the wireless tag being separated from the reader/writer. As for a way to deal with memory corruption, there is a process wherein, with the nonvolatile memory of a wireless tag, the latest data is not overwritten on most recently written data, but is written on a recording region separated from the storage region of the most recently written data (e.g., see Japanese Patent Document No. 3702923).

SUMMARY OF THE INVENTION

Wireless tags can be employed for various types of services in addition to the above electronic commuter passes and electronic money, for example, such as entering and leaving management, inventory management, and so forth, but in order to provide a service which is not stressful for the user, writing processing time used for writing data in nonvolatile memory housed in a wireless tag has to be shortened.

On the other hand, in order to increase a retention property for retaining (the state of) the memory cell of nonvolatile memory housed in the wireless tag in an erased (Erase) state in which no data is written (data is eliminated), or in a written (Write) state in which data is written, for long time, electric charge (electron or electron hole) has to be sufficiently accumulated in a floating gate of a transistor making up the memory cell.

FIG. 1 is a diagram for describing writing of data in EEPROM which is nonvolatile memory. In the event of writing data in EEPROM, erasing for changing the memory cell to an erased state is performed, and then writing for changing the memory cell in an erased state to a written state is performed. For example, With EEPROM, in order to maintain a certain level of retention property, electric charge accumulation time for accumulating electric charge in the floating gate is longer than time for the memory cell proceeding from the erased state to the written state.

If the electric charge accumulation time is shortened, the writing processing time can be reduced, but upon the electric charge accumulation time being shortened, the retention property deteriorates. Accordingly, shortening the writing processing time, and maintaining the retention property have a trade-off relation, but in the event that the retention property deteriorates, and neither the written state nor the erased state are maintained, the wireless tag is in an unusable state, and accordingly, it is undesirable to shorten the writing processing time by sacrificing the retention property.

It has been found to be desirable to enable the retention property to be maintained, and also to enable the writing processing time to be shortened.

A communication device according to an embodiment of the present invention is a communication device including: a communication unit configured to perform proximity communication with a reader/writer; and a control unit configured to control writing of data as to nonvolatile memory in accordance with a command from the reader/writer; with a portion of the storage region of the nonvolatile memory being a user block that is a storage region equivalent to the minimum unit assigned to a service; with the user block including a plurality of units; with the units including one or more pages that are the storage regions of a predetermined unit where writing is performed; with at least one unit of a plurality of units making up the user block being a buffer unit that serves as a buffer to buffer data to be written in the user block; with the nonvolatile memory storing control information for controlling the storage region of the nonvolatile memory; with the control information including a unit number for determining the units; with the control unit writing data in the buffer unit in accordance with a command from the reader/writer, writing the unit number of an object unit that is a unit to be written with data as the unit number of the buffer unit, and taking the object unit as a new buffer unit, thereby performing writing of data in the object unit; and with the control unit being activated by an RF signal being received from the reader/writer at the communication unit, and after activation, erasing all of the pages of the buffer unit during activation processing to be performed before receiving a command from the reader/writer.

A communication method according to an embodiment of the present invention is a communication method for a communication device including a communication unit configured to perform proximity communication with a reader/writer, and a control unit configured to control writing of data as to nonvolatile memory in accordance with a command from the reader/writer, including the steps of: taking a portion of the store region of the nonvolatile memory as a user block that is a storage region equivalent to the minimum unit assigned to a service; including a plurality of units in the user block; including one or more pages that are the storage regions of a predetermined unit where writing is performed, in the units; taking at least one unit of a plurality of units making up the user block as a buffer unit that serves as a buffer to buffer data to be written in the user block; the nonvolatile memory storing control information for controlling the storage region of the nonvolatile memory; including a unit number for determining the units, in the control information; causing the control unit to write data in the buffer unit in accordance with a command from the reader/writer, to write the unit number of an object unit that is a unit to be written with data as the unit number of the buffer unit, and to take the object unit as a new buffer unit, thereby performing writing of data in the object unit; and activating the control unit by an RF signal being received from the reader/writer at the communication unit to erase all of the pages of the buffer unit during activation processing to be performed before receiving a command from the reader/writer.

With the above embodiment, a portion of the storage region of the nonvolatile memory is a user block that is a storage region equivalent to the minimum unit assigned to a service, the user block includes a plurality of units, the units include one or more pages that are the storage regions of a predetermined unit where writing is performed, at least one unit of a plurality of units making up the user block is a buffer unit that serves as a buffer to buffer data to be written in the user block, the nonvolatile memory stores control information for controlling the storage region of the nonvolatile memory, the control information includes a unit number for determining the units, the control unit writes data in the buffer unit in accordance with a command from the reader/writer, writes the unit number of an object unit that is a unit to be written with data as the unit number of the buffer unit, and takes the object unit as a new buffer unit, thereby performing writing of data in the object unit. Also, the control unit is activated by an RF signal being received from the reader/writer at the communication unit, and erases all of the pages of the buffer unit during activation processing to be performed before receiving a command from the reader/writer.

Note that the communication device may be a stand-alone device, or may be an internal block making up part of a single device.

According to an embodiment of the present invention, the retention property of the nonvolatile memory can be maintained, and also the writing processing time used for writing can be reduced.

BRIEF DESCRIPTION OF THE DRAWINGS

FIG. 9 is a flowchart for describing processing of the wireless tag.

DESCRIPTION OF THE PREFERRED EMBODIMENTS

Embodiment of Communication System to which Present Invention has been Applied

Figure 2:
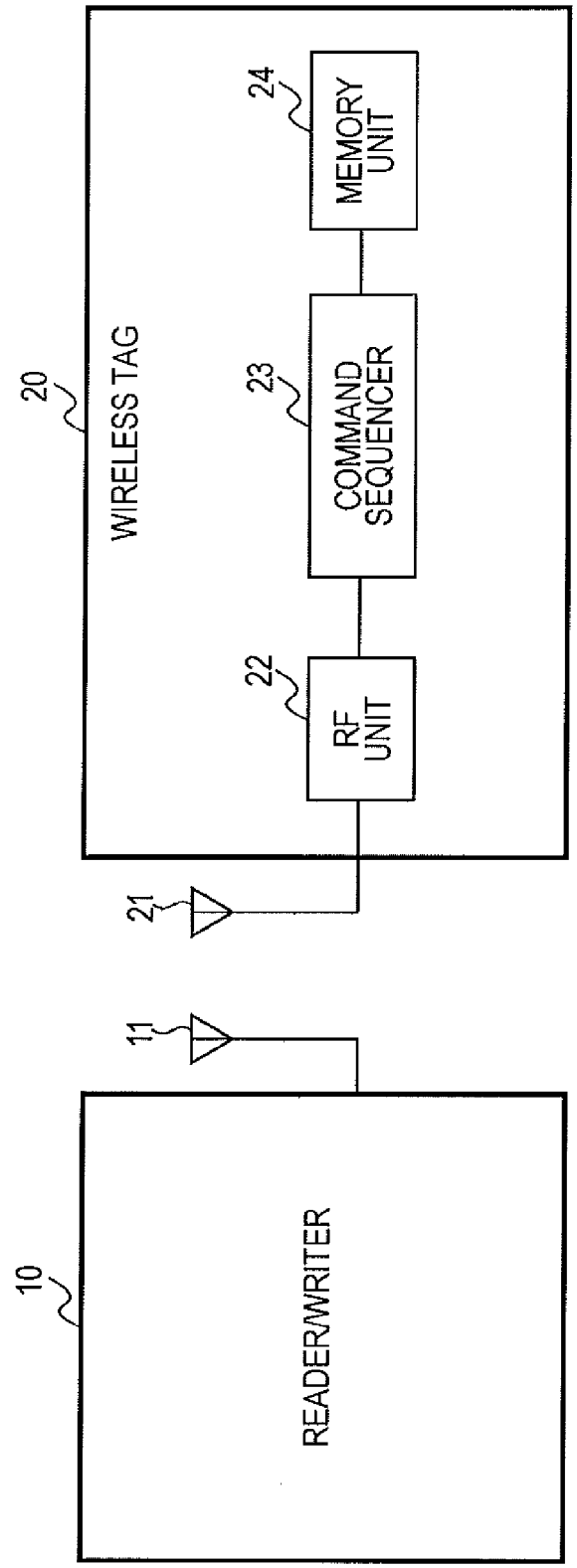
FIG. 2 is a block diagram illustrating a configuration example of an embodiment of a communication system to which the present invention has been applied.

FIG. 2 is a block diagram illustrating a configuration example of an embodiment of a communication system (system means a group wherein multiple devices are logically grouped, regardless of whether or not each component device is included in the same casing) to which the present invention has been applied. In FIG. 2, the communication system is configured of a reader/writer 10, and a wireless tag 20.

The reader/writer 10 includes an antenna 11, and performs noncontact proximity communication with the wireless tag 20 by outputting RF signals from the antenna 11 to store (write) data in (a memory unit 24 housed in) the wireless tag 20 or read out data from the wireless tag 20.

Upon the wireless tag 20 approaching the reader/writer 10, the wireless tag 20 starts operation with RF signals which the reader/writer 10 outputs from the antenna 11 as power, and performs proximity communication with the reader/writer 10.

With proximity communication, the reader/writer 10 transmits data by modulating RF signals in accordance with the data, and the wireless tag 20 receives the data transmitted by the reader/writer 10 using the RF signals, and writes in a built-in memory unit 24.

Also, the wireless tag 20 reads out the data stored in the memory unit 24, subjects the RF signals transmitted from the reader/writer 10 to load modulation, thereby transmitting the data to the reader/writer 10. Specifically, the wireless tag 20 includes an antenna 21, an RF unit 22, a command sequencer unit 23, and the memory unit 24.

The antenna 21 is configured of a resonance circuit made up of a coil and a capacitor, for example, receives the RF signals from the reader/writer 10, and supplies to the RF unit 22. The RF unit 22 performs proximity communication with the reader/writer 10. Specifically, upon the RF signals from the reader/writer 10 being received by the reader/writer 10 and the wireless tag 20 approaching, the RF unit 22 obtains power serving as power supply from the RF signals thereof, and supplies to blocks as appropriate.

Also, the RF unit 22 demodulates the RF signals from the reader/writer 10 to obtain a command or data, and supplies to the command sequencer unit 23. Further, the RF unit 22 subjects the RF signals from the reader/writer 10 to load modulation in accordance with the data supplied from the command sequencer unit 23, thereby transmitting the data to the reader/writer 10.

The command sequencer unit 23 performs sequence control in accordance with the command from the reader/writer 10, supplied from the RF unit 22, thereby performing control such as reading/writing of data as to the memory unit 24, and so forth. Specifically, in the event that the command from the reader/writer 10 is a write command for requesting writing of data, the command sequencer unit 23 writes the data transmitted from the reader/writer 10 and supplied from the RF unit 22 along with the write command in the memory unit 24.

Also, in the event that the command from the reader/writer 10 is a read command for requesting readout of data, the command sequencer unit 23 reads out the data from the memory unit 24, and supplies to the RF unit 22. The memory unit 24 is nonvolatile memory such as EEPROM or the like, for example, and stores data under the control (management) of the command sequencer unit 23.

Logical Format of Memory Unit 24

Figure 1:
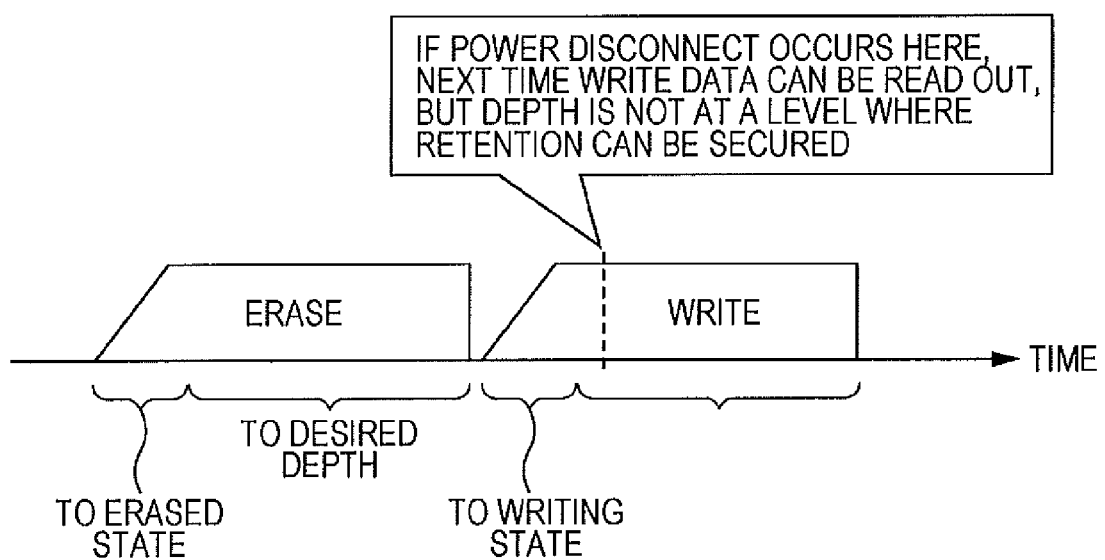
FIG. 1 is a diagram for describing writing of data in EEPROM which is nonvolatile memory.
Figure 3:
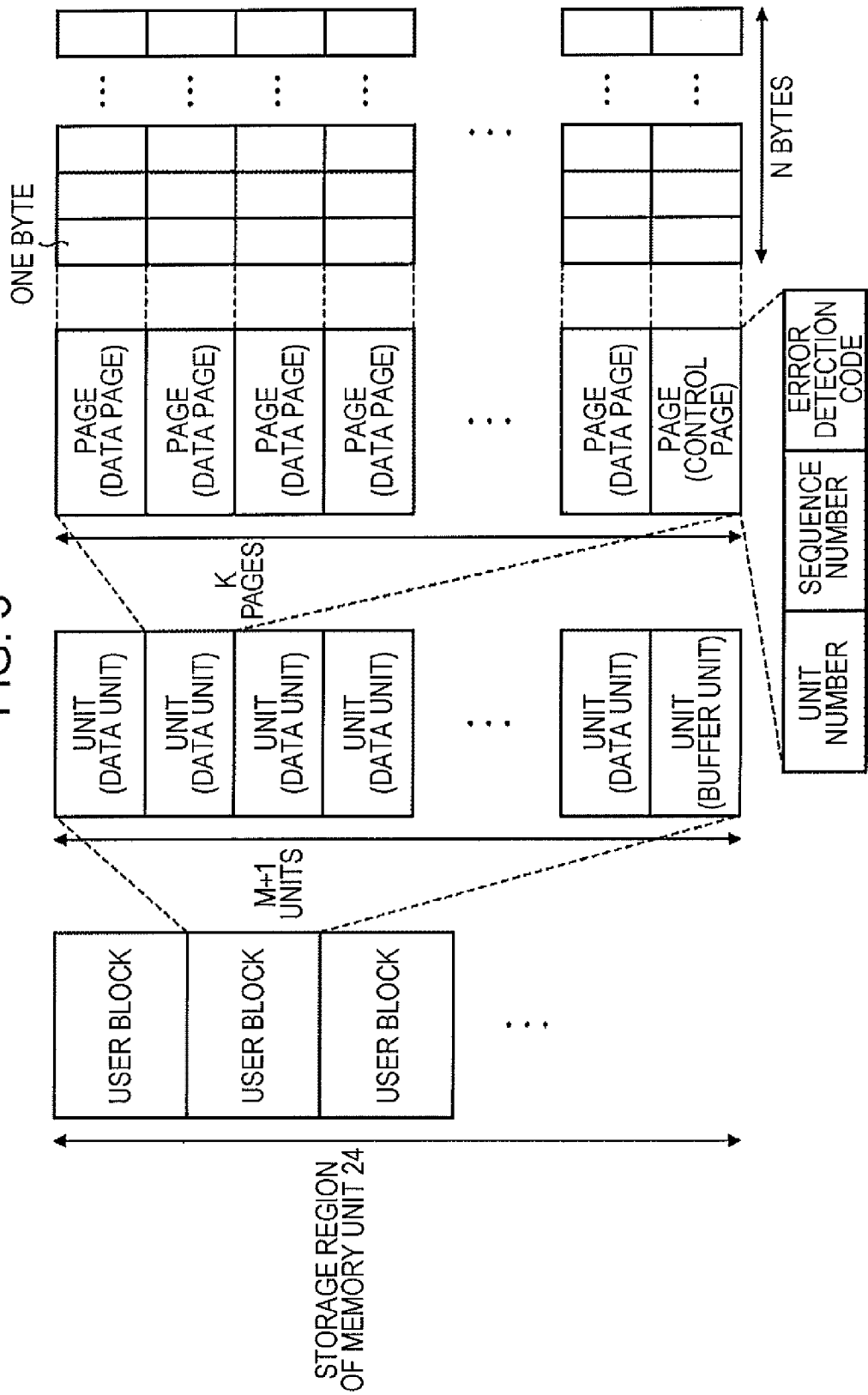
FIG. 3 is a diagram illustrating an example of the logical format of a memory unit.

FIG. 3 is a diagram for describing the logical format of the memory unit 24 included in the wireless tag 20 in FIG. 1. A portion of the storage region of the memory unit 24 serves as a user block that is a storage region equivalent to the minimum unit assigned to a service, for example, such as commuter passes, electronic money which a predetermined service provider manages, tickets for events or the like, and so forth.

There are provided one or more user blocks to the memory unit 24. Here, one or more user blocks are assigned to a service, and data for providing the service is stored in the one or more user blocks thereof. The user blocks have M+1, more than one, units (M is an integer equal to or greater than one). Data for providing a service is written in the units. However, one unit of M+1 units making up a user block serves as a buffer for buffering the data written in the user block.

As described above, one unit making up a user block serves as a buffer, and accordingly, the user block includes M+1, more than one, units in total of one unit serving as a buffer, and M, equal to or greater than one, units storing data for providing a service.

Hereafter, of the M+1 units making up a user block, a unit serving as a buffer will also be referred to as a buffer unit, and the units other than the buffer unit will also be referred to as data units.

In FIG. 3, of the M+1 units making up a user block, the M+1'th unit serves as a buffer unit, and the other first through M'th units serve as data units. Note that the unit serving as a buffer unit changes when writing of data as to a user block is performed, but description thereof will be described later. The units include K, equal to or greater than one, pages.

The pages are storage regions equivalent to the minimum unit where writing as to the memory unit 24 is performed, and in FIG. 3, one page is an N-byte storage region. Here, in FIG. 3, one page of pages that a unit has is used as a page (control page) that stores control information for controlling the storage region of the memory unit 24. That is to say, in FIG. 3, one particular page of K pages making up a unit serves as a control page in which control information for controlling the unit thereof is stored.

Accordingly, in FIG. 3, one or more pages (data pages) in which data is stored, and one page serving as a control page has to be provided to a unit, and accordingly, the number K of pages making up a unit is more than one. Note that, in FIG. 3, the K'th page of K pages making up a unit serves as a control page. The page serving as a control page does not change (unlike the buffer unit), and is a fixed page.

A unit number, (one) sequence number, and an error detection code are written in the control page as the control information of a unit. The unit number is information for determining a unit having a control page in which the unit number thereof is written.

The sequence number is a value regularly updated each time data is written in the memory unit 24, and there can be employed as the sequence number, for example, a value obtained by incrementing or decrementing the immediately preceding value by a predetermined value such as one, a value obtained by calculating a predetermined function with the immediately preceding value as an argument, an output value obtained with the immediately preceding value as an input value using a table correlated with an input value and an output value, or the like. Now, let us say here that a value to be incremented by one each time data is written in the memory unit 24 is used as the sequence number, for example. The error detection code is a code for error detection for detecting an error of data written in a unit, and an example thereof is CRC (Cyclic Redundancy Checking).

Writing Control of Data as to Memory Unit 24

Figure 4:
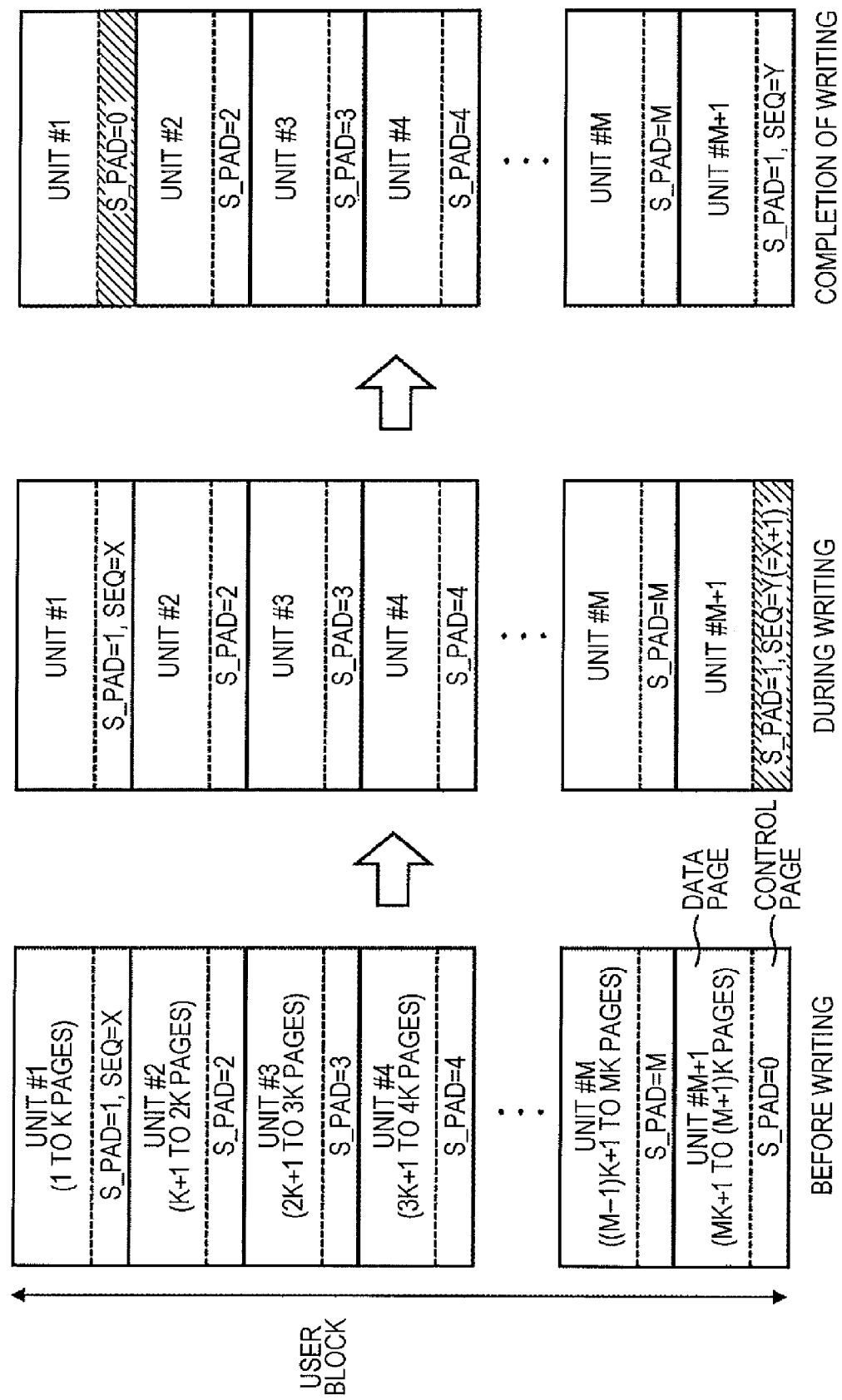
FIG. 4 is a diagram for describing writing of data as to the memory unit.

FIG. 4 is a diagram for describing data writing control as to the memory unit 24 by the command sequencer unit 23. In FIG. 4, a user block having units in which data is written have M+1 units #1, #2, . . . , #M+1. In FIG. 4, immediately before writing of data is performed (before writing), of the M+1 units #1, #2, and so on through #M+1, for example, the M+1'th unit #M+1 serves as a buffer unit, and the other first through M'th unit #1 through #M serve as data units. Also, in FIG. 4, the unit number S_PAD of a data unit #m is a value m before writing.

Note that, the unit number S_PAD is not appended to a buffer unit, but in FIG. 4, for the sake of convenience we will say that the unit number S_PAD of the unit #M+1 serving as a buffer unit is set to 0 serving as a value representing the buffer unit.

Also, in FIG. 4, the sequence number SEQ of the data unit #1 before writing is a value X. Drawing of the sequence numbers SEQ of the other data units #2 through #M is omitted.

Here, one unit #m is made up of K pages. Now, if we say that the first page of the first unit #1 of a user block is taken as the first page, the unit #m is made up of K pages of the (m−1)K+1'th page through the mK'th page. The mK'th page that is the last page of each unit #m is a control page.

Now, for example, let us say that a write command for requesting writing of data as to a unit of which the unit number S_PAD is a value 1 has been transmitted from the reader/writer 10 to the wireless tag 20 along with data.

In this case, the command sequencer unit 23 writes, in accordance with the write command from the reader/writer 10, the data transmitted along with the write command thereof not in an object unit that is a unit to be written, i.e., the unit #1 of which the unit number S_PAD is a value 1 (the unit of the unit number S_PAD where writing is requested by the write command) but in the unit #M+1 serving as a buffer unit.

Further, the command sequencer unit 23 writes the same unit number S_PAD=1 as the unit number S_PAD=1 of the unit #1 that is an object unit, the sequence number SEQ updated to a predetermined value Y, and error detection code in the control page of the unit #M+1 serving as a buffer unit.

Here, in FIG. 4 (the same applies to later-described FIG. 5), drawing of the error detection code is omitted. Also, in FIG. 4, the value Y of the sequence number SEQ to be written in the control page of the unit #M+1 serving as a buffer unit is a value X+1 updated by incrementing the sequence number SEQ=X written in the control page of the unit #1 that is an object unit by one.

As described above, the unit number S_PAD of which the value is 1, the sequence number SEQ updated to a predetermined value Y, and the error detection code are written in the control page of the unit #M+1 serving as a buffer unit, whereby the unit #M+1 changes from the buffer unit to a data unit of which the unit number S_PAD is a value 1. As a result thereof, at this point, the number of units of which the unit numbers S_PAD are values 1 is two of the unit #1 and unit #M+1.

However, the sequence number SEQ=Y of the unit #M+1 is a value newer than the sequence number SEQ=X of the unit #1, i.e., a value X+1 obtained by updating the sequence number SEQ=X. Accordingly, with regard to the two units #1 and #M+1 of which the unit numbers S_PAD are values 1, the unit #M+1 in which the latest data has been written, and the unit #1 in which data was written in the past (of data written in units of which the unit numbers S_PAD are values 1, a unit storing data written immediately before the latest data) can be distinguished by referencing the sequence numbers SEQ.

Here, in the event that there are two units having the same unit number S_PAD, of the two units thereof, a unit in which the latest data is written (a unit having a greater sequence number in the present embodiment) will also be referred to as a new unit, and a unit in which data was written in the past (a unit having a smaller sequence number) will also be referred to as an old unit.

Subsequently, the command sequencer unit 23 erases the old unit of the two units #1 and #M+1 of which the unit numbers S_PAD are values 1, i.e., the control page of the unit #1 that is an object unit, and sets to the erased state, thereby writing processing for writing data in the memory unit 24 is completed with the unit #1 as a new buffer unit.

Note that, as described above, the unit number S_PAD is not appended to buffer units, but in FIG. 4, the unit number S_PAD of the unit #1 serving as a new buffer unit is set to a value 0 representing that this unit is a buffer unit.

As described above, the command sequencer unit 23 writes, in accordance with the write command from the reader/writer 10, data in the unit #M+1 serving as a buffer unit, writes the unit number S_PAD=1 of the unit #1 that is an object unit as the unit number of the buffer unit, and takes the unit #1 as a new buffer unit, thereby consequently performing writing of data as to the unit #M+1 of which the unit number S_PAD is a value 1 that has become an object unit.

As a result thereof, with the memory unit 24, with regard to data stored in the units of which the unit numbers S_PAD are values 1, the latest data (data written in the unit #M+1 in FIG. 4), is written while the immediately preceding (last) data (data written in the unit #1 in FIG. 4) remains, whereby memory corruption, i.e., for example, a case where inconsistency has occurred in data stored in the memory unit 24 due to the wireless tag 20 having been separated from the reader/writer 10 while accessing the memory unit 24 is performed, or the like, can be handled.

Figure 5:
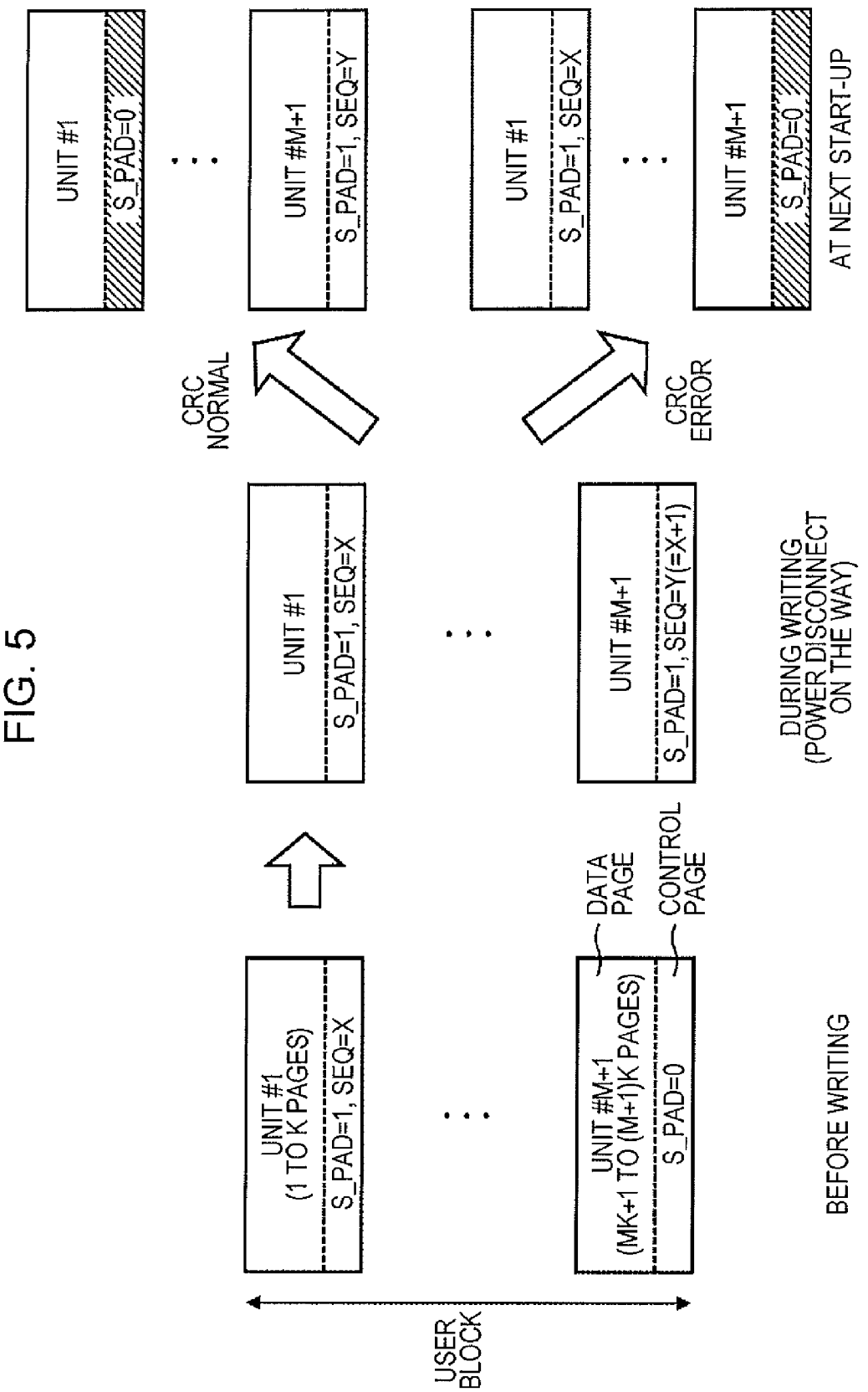
FIG. 5 is a diagram for describing handling of memory corruption.

FIG. 5 is a diagram for describing handling of memory corruption. In FIG. 5, before writing, in the same way as with the case in FIG. 4, the M+1'th unit #M+1 unit #M+1 serves as a buffer unit, and the other first through M'th units #1 through #M serve as data units. Also, before writing, the unit number S_PAD of the data unit #m has a value m, and the unit number S_PAD of the unit #M+1 serving as a buffer unit has a value 0 representing that this unit is a buffer unit.

Now, for example, in the same way as with the case in FIG. 4, let us say that a write command for requesting writing of data with a unit of which the unit number S_PAD is a value 1 as an object unit has been transmitted from the reader/writer 10 to the wireless tag 20 along with the data.

In this case, the command sequencer unit 23 writes, as described in FIG. 4, in accordance with the write command from the reader/writer 10, the data transmitted along with the write command in the unit #M+1 serving as a buffer unit (unit of which the unit number S_PAD is a value 0).

Further, the command sequencer unit 23 writes, as described in FIG. 4, the same unit number S_PAD=1 as the unit number S_PAD=1 of the unit #1 that is an object unit, the sequence number SEQ of a value Y=X+1 obtained by updating the sequence number SEQ=X of the unit #1 that is an object unit, and the error detection code in the control page of the unit #M+1 serving as a buffer unit, and then erases the control page of the unit #1 that is an object unit to set to the erased state, whereby the writing processing for writing data in the memory unit 24 is completed with the unit #1 as a new buffer unit.

Now, let us say that during the writing processing, i.e., for example, while the unit number S_PAD=1, the sequence number SEQ updated to a predetermined value Y, and the error detection code have been writing in the control page of the unit #M+1 serving as a buffer unit, the wireless tag 20 has been separated from the reader/writer 10, and power has not been supplied to the wireless tag 20 (power disconnect).

In this case, the command sequencer unit 23 recovers the storage content of the memory unit 24 at the time of being activated (at the time of the next activation) by the reader/writer 10 and the wireless tag 20 approaching, and power being supplied.

Specifically, for example, if we say that of the unit number S_PAD=1, the sequence number SEQ of a predetermined value Y, and the error detection code, at least the unit number S_PAD=1, and the sequence number SEQ updated to a predetermined value Y are written in the control page of the unit #M+1 serving as a buffer unit, and then power supply is disconnected, there are two units #1 and #M+1 of which the unit numbers S_PAD have the same value 1.

As described in FIG. 4, with regard to the two units #1 and #M+1 of which the unit numbers S_PAD are values 1, the unit (new unit) #M+1 in which the latest data has been written, and the unit (old unit) #1 in which data was written in the past can be distinguished by referencing the sequence numbers SEQ.

At the time of the next activation, the command sequencer unit 23 uses CRC serving as the error detection code of the control page of the unit #M+1 that is a new unit to perform error detection, and in the event that no error has been detected (in the event that the error detection code is normal), assumes that writing of data in the unit #M+1 that is a new unit has been completed in a normal manner, erases the control page of the unit #1 that is an old unit to set to the erased state (in FIG. 5, the unit number S_PAD is set to a value 0 representing that this unit is a buffer unit), thereby taking the unit #1 as a buffer unit. Subsequently, as described in FIG. 4, writing of new data in the buffer unit is performed.

On the other hand, as a result of error detection using CRC serving as the error detection code of the control page of the unit #M+1 that is a new unit, in the event that an error has been detected (in the event that the error detection code is an error), the command sequencer unit 23 returns the state of the memory unit 24 to a state immediately before writing of data in the unit #M+1 that is a new unit is performed assuming that writing of the data in the unit #M+1 that is a new unit has not been completed in a normal manner, for example.

That is to say, the command sequencer unit 23 erases the control page of the unit #M+1 that is a new unit to set to the erased state (in FIG. 5, the unit number S_PAD is set to a value 0 representing that this unit is a buffer unit), thereby taking the unit #M+1 as a buffer unit. Subsequently, as described in FIG. 4, writing of new data in the buffer unit is performed.

Processing of Wireless Tag 20

Figure 6:
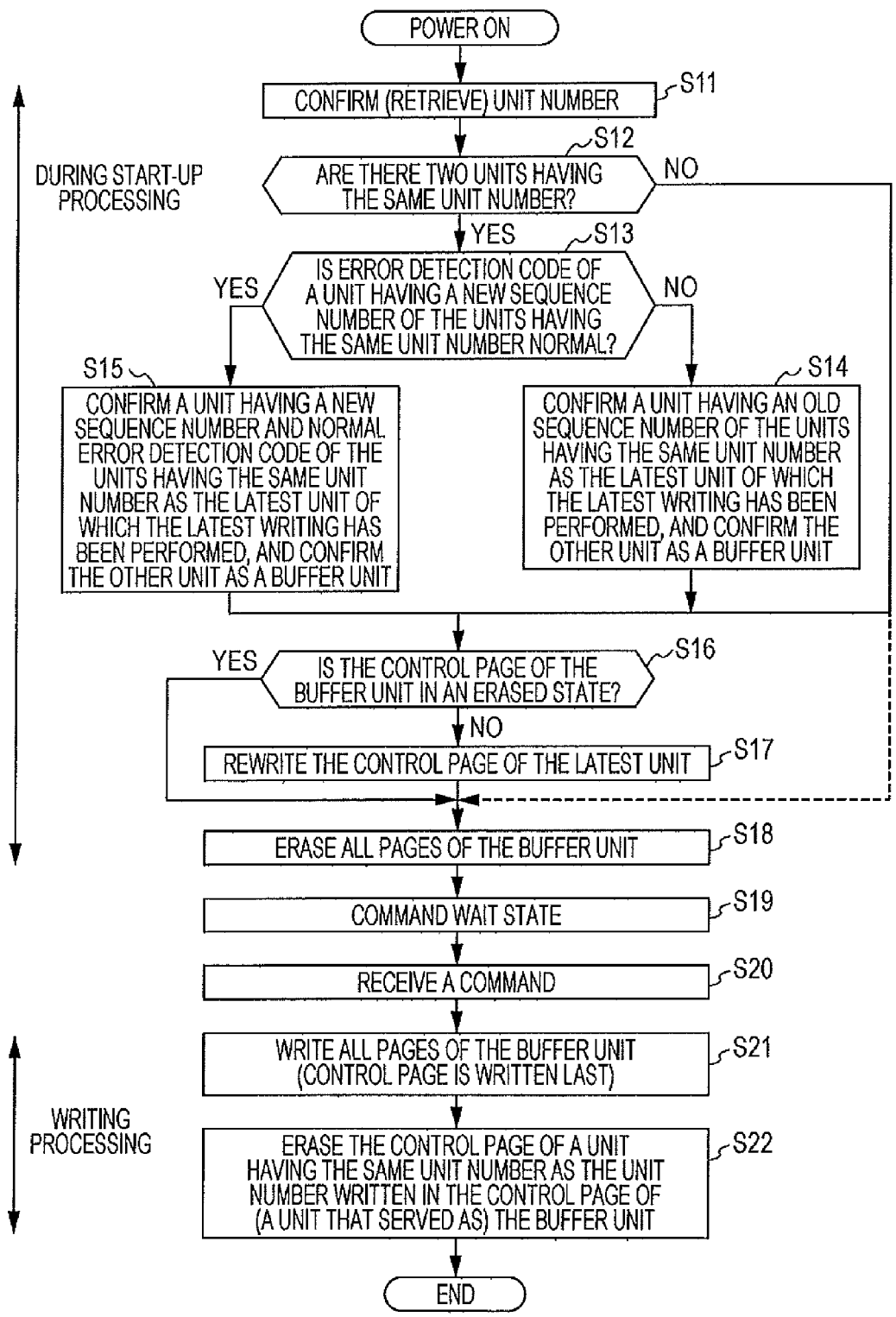
FIG. 6 is a flowchart for describing processing of a wireless tag.

FIG. 6 is a flowchart for describing the processing of the wireless tag 20 in FIG. 2. Note that hereafter, description will be focused on one user block, and processing as to the one user block thereof will be described.

Upon the reader/writer 10 and the wireless tag 20 approaching, the RF signals from the reader/writer 10 being received at the RF unit of the wireless tag 20, and power supply to appropriate blocks of the wireless tag 20 being started, the command sequencer unit 23 is activated. Subsequently, before receiving the command from the reader/writer 10 after activation, the command sequencer unit starts, for example, predetermined activation processing for performing proximity communication with the reader/writer 10, such as initializing of an unshown internal register, or the like.

Further, the command sequencer unit 23 erases all the pages of the buffer unit of the memory unit 24 (performs just processing to set to the erased state) to set to the erased state during the activation processing. Specifically, in step S11, the command sequencer unit 23 confirms the unit numbers S_PAD of the control pages of M+1 units #1 through #M+1 making up a user block of interest of the memory unit 24, and the processing proceeds to step S12.

In step S12, the command sequencer unit 23 determines, based on the confirmation result of the unit number S_PAD in step S11, whether or not there are units (two units) having the same unit number S_PAD.

In the event that determination is made in step S12 that there are no units having the same unit number S_PAD, i.e., in the event that there are units of which the control pages are in the erased state, i.e., there are buffer units, the processing skips steps S13 through S15 and proceeds to step S16.

Also, in the event that determination is made in step S12 that there are units having the same unit number S_PAD, i.e., for example, in the event that since the writing processing last performed has not been completed, as described in FIG. 5, there are no buffer units that are units of which the control pages are in the erased state, and there are two units having the same unit number S_PAD, the processing proceeds to step S13, where the command sequencer unit 23 uses of the two units having the same unit number S_PAD, the error detection code of a unit having a new sequence number SEQ (new unit) to perform error detection for determining whether or not the new unit has an error.

In the event that determination is made in step S13 that the new unit has an error (the error detection code is abnormal), the processing proceeds to step S14, where the command sequencer unit 23 confirms, of the two units having the same unit number S_PAD, a unit having a older sequence number SEQ (old unit) as the latest unit in which the latest normal writing has been performed.

Further, in step S14, the command sequencer unit 23 confirms the other unit (new unit) of the two units having the same unit number S_PAD as a buffer unit, and the processing proceeds to step S16.

Also, in the event that determination is made in step S13 that the new unit has no error (the error detection code is normal), the processing proceeds to step S15, where the command sequencer unit 23 confirms, of the two units having the same unit number S_PAD, a unit having a newer sequence number SEQ (new unit) as the latest unit in which the latest normal writing has been performed.

Further, in step S15, the command sequencer unit 23 confirms the other unit (old unit) of the two units having the same unit number S_PAD as a buffer unit, and the processing proceeds to step S16.

In step S16, the command sequencer unit 23 determines whether or not the control page of the buffer unit is in the erased state.

In the event that determination is made in step S16 that the control page of the buffer unit is in the erased state, i.e., in the event that erasing of the control page of the buffer unit has been performed in later-described step S22 of the writing processing last performed, the processing skips step S17 to proceed to step S18.

Also, in the event that determination is made in step S16 that the control page of the buffer unit is not in the erased state, i.e., in the event that erasing of the control page of the buffer unit has not been performed in later-described step S22 of the writing processing last performed, and accordingly, there might not have been performed accumulation of electric charge to the floating gate equivalent to a level wherein a sufficient retention property can be maintained regarding the control page of the latest unit in which writing of data was performed, serving as a buffer unit at the time of the writing processing last performed, in step S21 performed immediately before step S22, the processing proceeds to step S17, where the command sequencer unit 23 performs, as to the control page of the latest unit, rewriting of the storage content of the control page thereof, and processing proceeds to step S18.

With the rewriting of the storage content of the control page of the latest unit in step S17 to the control page, the command sequencer unit 23 writes the stored contents of the control page of the newest unit to the one control page alone, changes the control page to the writing state, and accumulates electric charge to the floating gate equivalent to a level wherein a sufficient retention property can be maintained.

Thus, with regard to the control page of the newest unit where data has been written due to having been the buffer unit at the previous write processing, in the event that there might not have been performed accumulation of electric charge to the floating gate equivalent to a level wherein a sufficient retention property can be maintained regarding the control page of the latest unit in which writing of data was performed, serving as a buffer unit at the time of the writing processing last performed, rewriting of the control page of the latest unit is performed, and accordingly, even when accumulation of electric charge as to the floating gate was insufficient due to the reader/writer 10 and the wireless tag having been separated before accumulation of sufficient electric charge as to the floating gate (accumulation of electric charge as to the floating gate equivalent to a level wherein sufficient retention property can be maintained) was performed, or the like, electric charge is sufficiently accumulated as to the floating gate according to the processing in step S17 performed during this activation processing, and the retention property can be maintained.

In step S18, the command sequencer unit 23 erases all the pages of the buffer unit, and sets to the erased state.

The following processing in step S11 through S18 is performed during the activation processing. With the wireless tag 20, upon the activation processing being completed, the processing proceeds from step S18 to step S19, where the wireless tag 20 proceeds to a command standby state to wait for a command from the reader/writer 10.

After awaiting for a command to be transmitted from the reader/writer 10, the processing proceeds from step S19 to step S20, where the RF unit 22 receives the command from the reader/writer 10, supplies to the command sequencer unit 23, and the processing proceeds to step S21.

For example, now, let us say that the command from the reader/writer 10 is a write command, writing processing is performed in step S21 and subsequent step S22 in accordance with the write command thereof.

Specifically, in step S21, the command sequencer unit 23 writes, in accordance with the write command from the reader/writer 10, data transmitted from the reader/writer 10 along with the write command thereof in pages other than the control page of the buffer unit (performs just processing for proceeding to the writing state) to set to the writing state.

Here, with an existing wireless tag, at the time of writing of data in nonvolatile memory, erasing for changing the memory cell to the erased state is performed after reception of the write command from a reader/writer, and then writing for changing the memory cell in the erased state to the writing state is performed.

In FIG. 6, erasing of all the pages of the buffer unit has already been performed in step S18 performed during the activation processing, and accordingly, erasing does not have to be performed before writing in step S21.

In step S21, the command sequencer unit 23 writes data in pages other than the control page of the buffer unit, and then further writes (only writes) the unit number, sequence number, and error detection code to the control page of the buffer unit to set to the writing state.

Note that the unit number written in the control page of the buffer unit in step S21 is the unit number of an object unit in which the data is written, and is included in the write command from the reader/writer, for example.

Also, the sequence number written in the control page of the buffer unit in step S21 is a value obtained by incrementing the sequence number already written in the control page of the object unit by one.

Further, the error detection code written in the control page of the buffer unit in step S21 is obtained as to data written in pages other than the control page of the buffer unit at the command sequencer unit 23 (or the data thereof, and the unit number written in the control page, and the sequence number).

Upon the data being written in pages other than the control page of the buffer unit, and further the unit number, sequence number, and error detection code being written in the control page of the buffer unit, in step S21 the processing proceeds to step S22, where the command sequencer unit 23 erases the control page of a unit (data unit) having the same sequence number as the sequence number written in the control page of the buffer unit in immediately preceding step S21, and completes the writing processing.

Specifically, upon the sequence number being written in the control page of the buffer unit in immediately preceding step S21, the user block in interest is in a state in which there are two units of a new unit (a unit that has been a buffer unit where writing of the control page was performed in immediately preceding step S21) and an old unit that is also an object unit as the units of the sequence number thereof.

In step S22, the command sequencer unit 23 takes, of the new unit and the old unit thereof, the old unit thereof as a new buffer unit by erasing (only erasing) the control page of the old unit (object unit).

As described above, with the wireless tag 20, the command sequencer unit 23 is activated by the RF signals from the read/writer 10 being received at the RF unit 22, and erases all the pages of the buffer unit during the activation processing performed before receiving the command from the reader/writer 10 after the activation (step S18), and accordingly, after receiving the write command from the reader/writer 10, just writing for changing the memory cell to the writing state has to be performed without performing erasing for changing the memory cell to the erased state, with writing of data in the memory unit 24 which is nonvolatile memory.

Accordingly, after receiving the write command, with writing, even when taking the same time as with the related art for electric charge accumulation time (time for accumulating electric charge as to the floating gate) for the retention property for maintaining the writing state, time since the write command was received until the writing processing for writing data in the memory unit 24 is completed (writing processing time) can be reduced by an amount equivalent to the time saved by erasing being omitted. That is to say, the same retention property as with the related art can be maintained, and also the writing processing time can be reduced.

Note that, in the event that determination is made in step S12 in FIG. 6 that there is no unit having the same unit number S_PAD, i.e., in the event that there is a buffer unit of which the control page is in the erased state, and in the event that determination is made in step S13 that the new unit has an error, and in step S14, of the two units having the same unit number S_PAD, the old unit (a unit having an older sequence number SEQ) is taken as the latest unit, and also the new unit is taken as a buffer unit, in either case, the processing has been arranged to proceed to step S16, but in these cases, the processing may proceed to step S18 instead of step S16.

That is to say, as described above, in step S16 determination is made whether or not the control page of the buffer unit is in the erased state.

Subsequently, in the event that the control page of the buffer unit is not in the erased state, there might have been a possibility that with the writing processing last performed, erasing of the control page of the buffer unit was not performed in step S22, and accordingly, writing in step S21 immediately before step S22 was not completed until accumulation of sufficient electric charge as to the floating gate is performed regarding the control page of the latest unit that serving a buffer unit at the time of the writing processing last performed where writing of data was performed, and accordingly, in step S17 rewriting of the control page of the latest unit is performed to maintain the retention property of the control page of the latest unit.

On the other hand, in step S12, a case where determination is made that there are no units having the same unit number S_PAD is a case where there is a buffer unit of which the control page is in the erased state, and in the event that there is a buffer unit, in step S22 serving as the writing processing last performed, erasing of the control page of the unit serving as the buffer unit thereof was performed, and accordingly, writing in step S21 was completed regarding the unit serving as the buffer unit at the time of the writing processing last performed, and accumulation of sufficient electric charge as to the floating gate was performed regarding the control page of the unit thereof.

Accordingly, the retention property of the control page can be maintained, and accordingly, rewriting of the control page does not have to be performed in step S17.

Also, in the event that there are two units having the same unit number S_PAD, and the old unit of the two units thereof is taken as the latest unit in step S14, with regard to the control page of the old unit serving as the latest unit, when the old unit was a buffer unit the last time, rewriting of the control page was performed in step S17 during the activation processing performed after data was written as appropriate, and accordingly, the retention property of the control page has already been maintained, and rewriting of the control page does not have to be performed in step S17 this time.

Accordingly, in the event that determination is made in step S12 that there are no units having the same unit number S_PAD, and in the event that the old unit of the two units having the same unit number S_PAD is taken as the latest unit in step S14, in either case, the retention property of the control page has already been maintained, and accordingly, in these cases, the processing may proceed to step S18 instead of step S16.

Writing Processing Time

Figure 7:
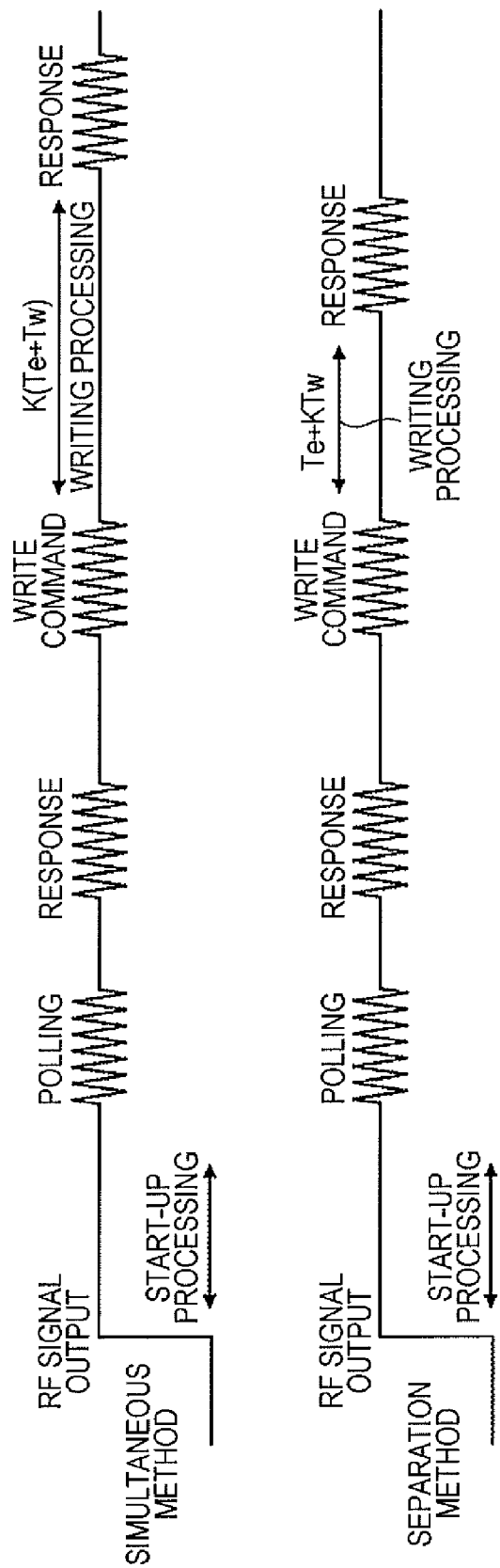
FIG. 7 is a diagram for describing writing processing time of the wireless tag.

FIG. 7 is a diagram for describing the writing processing time of the wireless tag 20. Thus, with an existing wireless tag, at the time of writing of data in nonvolatile memory, erasing for changing the memory cell to the erased state is performed after reception of the write command from a reader/writer, and then writing for changing the memory cell in the erased state to the writing state is performed. In this way, a method for performing erasing and writing for writing of data after reception of a write command to write the data in the nonvolatile memory will be referred to as a simultaneous method.

On the other hand, as described in FIG. 6, a method wherein during the activation processing of the wireless tag 20, erasing of all the pages of the buffer unit is performed (only erasing of erasing and writing for writing of data is performed), and after reception of the write command from the reader/writer 10, writing of data is performed (only writing of erasing and writing for writing of data is performed) as to the buffer unit, thereby writing the data in the memory unit 24, will be referred to as a separation method.

With the simultaneous method, as illustrated in FIG. 7, upon a wireless tag and a reader/writer being in the approaching state, and output of RF signals from the reader/writer being started, the wireless tag is activated with the RF signals thereof as power supply, and activation processing is started. Further, the wireless tag awaits polling being transmitted from the reader/writer after completion of the activation processing, receives the polling thereof, and returns a response as to the polling thereof.

Note that time after output of the RF signals until the reader/writer transmits polling is several 10 milliseconds or so, for example. The activation processing ends for 10 milliseconds or so, for example.

Subsequently, upon a write command being transmitted from the reader/writer, the wireless tag receives the write command thereof. Further, the wireless tag performs writing processing for writing data transmitted from the reader/writer along with the write command in nonvolatile memory in accordance with the write command from the reader/writer.

Note that time since the reader/writer received the response from the wireless tag until transmission of the next command is started is 2.4 milliseconds or more, for example.

Upon the writing processing being completed, the wireless tag returns a response corresponding to the write command.

As described above, with the writing processing of the simultaneous method, after reception of the write command, the wireless tag performs erasing and writing to write data in nonvolatile memory. Accordingly, if we say that a unit (buffer unit) is made up of K pages, time for erasing one page is taken as Te second, and also takes time used for writing one page as TW second, it takes K×(Te+Tw) seconds to perform the writing processing of the simultaneous method.

On the other hand, with the separation method as illustrated in FIG. 7, upon the reader/writer 10 and the wireless tag 20 being in the approaching state, and output of RF signals from the reader/writer 10 being started, the wireless tag 20 is activated with the RF signals thereof as power supply, and activation processing is started.

With the activation processing, as described in FIG. 6, erasing of all the pages of the buffer unit is performed at the wireless tag 20. After completion of the activation processing, the wireless tag 20 awaits polling being transmitted from the reader/writer 10, receives the polling thereof, and returns a response corresponding to the polling thereof.

Subsequently, upon a write command being transmitted from the reader/writer 10, the wireless tag 20 receives the write command thereof. Further, the wireless tag 20 performs, in accordance with a write command from the read/writer 10, writing processing for writing data transmitted from the reader/writer 10 along with the write command thereof in (the buffer unit of) the memory unit 24. Subsequently, upon the writing processing being completed, the wireless tag 20 returns a response corresponding to the write command.

With the writing processing of the separation method, as described in FIG. 6, after reception of the write command, the wireless tag 20 performs just writing in (all the pages of) the buffer unit, and writes data in the memory unit 24. That is to say, erasing of the buffer unit has already been performed during the activation processing, and accordingly, erasing of the buffer unit is not performed (does not have to be performed) after reception of the write command from the reader/writer 10.

With the separation method, after performing writing in the buffer unit (step S21), as described in FIG. 6, the wireless tag 20 performs erasing of one page that is the control page of the object unit (step S22), and the writing processing is completed. Accordingly, as described above, if we say that the buffer unit is made up of K pages, time for erasing one page is taken as Te second, and also takes time used for writing one page as TW second, time used for the writing processing of the separation method (writing processing time) is Te+K×Tw seconds.

As described above, the writing processing time used for the writing processing of the separation method is reduced by (K−1)×Te(=K×(Te+Tw)−(Te+K×Tw)) seconds as compared to the simultaneous method.

As described above, according to the separation method, erasing for writing is performed, as if it were, in a preceding manner during the activation processing, whereby the same retention property as with the simultaneous method can be maintained, and also the writing processing time since the write command was received can be reduced.

Another Embodiment of Logical Format of Memory Unit 24

Figure 8:
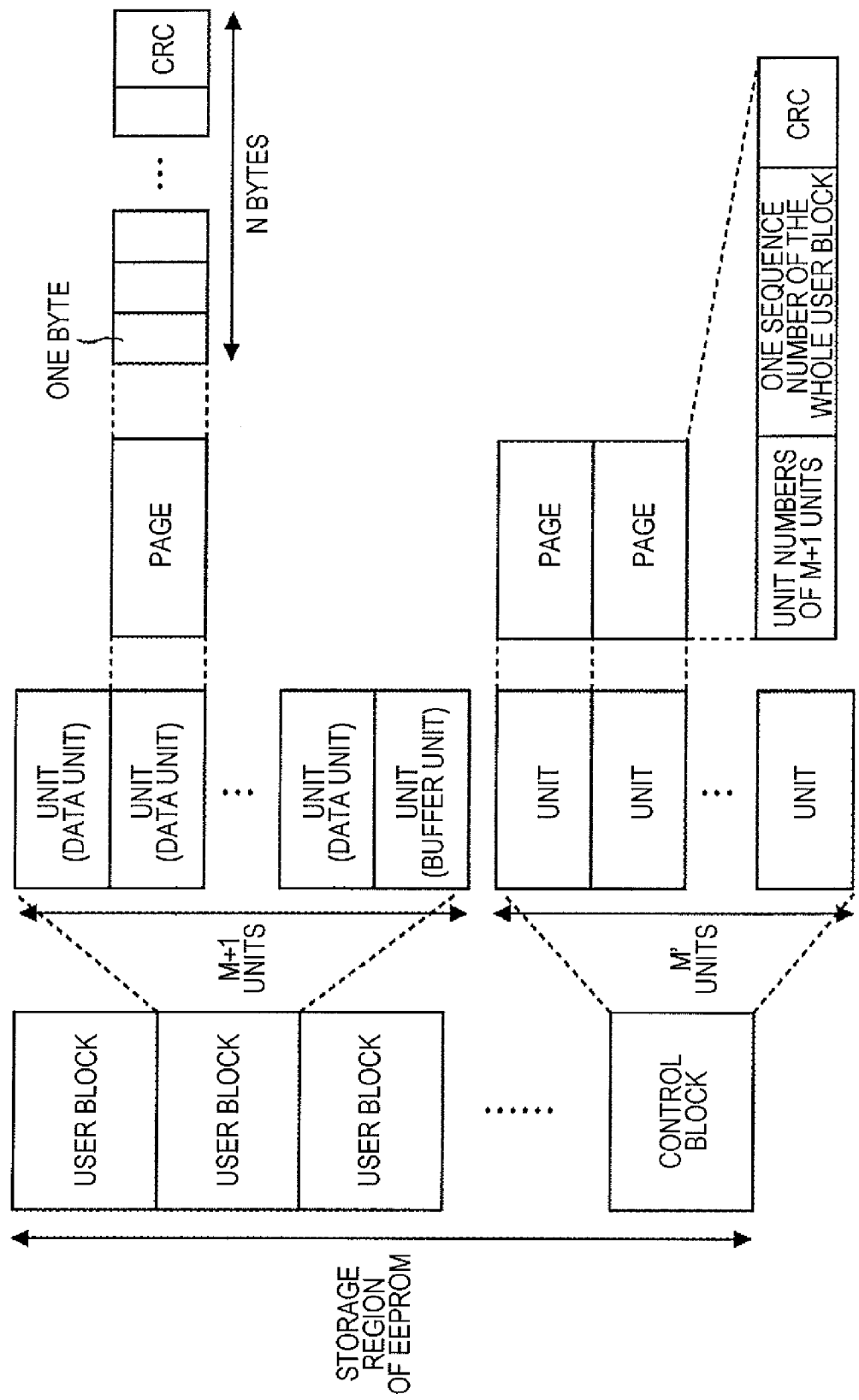
FIG. 8 is a diagram illustrating another example of the logical format of the memory unit.

FIG. 8 is a diagram for describing another embodiment of the logical format of the memory unit 24 included in the wireless tag 20 in FIG. 1. The logical format in FIG. 8 is common to the case in FIG. 3 in that a portion of the storage region of the memory unit 24 is one or more user blocks assigned to a service.

However, the logical format in FIG. 8 differs from the case in FIG. 3 where the control information is stored in a page (control page) in that another portion of the storage region of the memory unit 24 is a control block storing the control information.

Here, in FIG. 3, one or more pages (data pages) in which data is stored, and one control page in which the control information is stored are used for a unit, and accordingly, a unit is made up of multiple pages, but in FIG. 8, the control information is stored in the control block, and the control page is not used, and accordingly, a unit is made up of one or more pages. In FIG. 8, a unit is made up of one page. Accordingly, in FIG. 8, a unit is equal to the page. Also, in FIG. 8, data, CRC serving as the error detection code of the data thereof, and so forth are stored in a unit (equal to a page) of a user block.

The control block is made up of M', double of the number of user blocks, units (also serving as pages in FIG. 8), for example. Accordingly, if we say that the memory unit includes, for example, one user block, the control block includes the two units. The control information for each user block is stored in the control block. The control information of one user block is stored in two units of the control block.

Here, two units of the control block store the control information of one user block will also be referred to as two units of the control block corresponding to the user block thereof. Now, if we focus on a certain user block, the unit numbers S_PAD of M+1 units making up the user block of interest, one sequence number, CRC serving as the error detection codes of these (the unit numbers S_PAD of the M+1 units, and the one sequence number), and so forth are stored in each of two units (pages) of the control block corresponding to the user block of interest as the control information of the user block of interest.

Here, each time data is written in the user block of interest, after writing of data thereof, the control information of the user block of interest is alternately written in the two units of the control block corresponding to the user block of interest.

Accordingly, the latest control information of the user block of interest is stored in one unit of the two units of the control block corresponding to the user block of interest, and the control information immediately before the latest control information thereof was written is stored in the other unit.

As described above, each time data is written in the user block of interest, the control information of the user block of interest is alternately written in the two units of the control block corresponding to the user block of interest, and accordingly, the latest control information of the user block of interest, and the control information immediately before the latest control information thereof was written are stored, whereby memory corruption can be handled.

Note that the storage region in which the unit numbers S_PAD of the M+1 units are stored of each of the two units (pages) of the control block corresponding to the user block of interest are sectioned into M+1 storage regions (hereafter, also referred to as "regions for unit numbers") in which information (hereafter, also referred to as "unit number determining information") for determining the unit numbers S_PAD of the M+1 units making up the user block of interest is stored.

Subsequently, of the M+1 units #1 through #M+1 making up the user block of interest, a value m is employed as the unit number determining information of the m'th unit #m, and of the M+1 regions for unit numbers, the unit number determining information #m of the unit #m of which the unit number S_PAD is a value i is stored in the i'th region for unit numbers from the top.

Accordingly, of the M+1 regions for unit numbers, in the event that the unit number determining information #m is stored in the i'th region for unit numbers from the top, of the M+1 units #1 through #M+1 making up the user block of interest, the unit number S_PAD of the m'th unit #m is the value i.

As described above, in FIG. 8, the unit number determining information #m of the unit #m is written in the i'th region for unit numbers, and accordingly, the unit number S_PAD of the unit #m is determined to be the value i, whereby it can be said that the unit number S_PAD#i of the unit #m is included in the control information in a substantial (equivalent) manner. Here, in FIG. 8, as described above, one sequence number SEQ is included in the control information of the user block of interest, and accordingly, the sequence number SEQ thereof will be updated even if data is written in any unit of the user block of interest.

That is to say, in FIG. 3, control information exists for each unit, and one sequence number SEQ is included in the control information thereof, and accordingly, the sequence number SEQ included in the control information of a certain unit will be updated each time data is written in the unit thereof.

On the other hand, in FIG. 8, control information exists for each user block, and one sequence number SEQ is included in the control information thereof, and accordingly, the sequence number SEQ included in the control information of a certain user block will be updated even if data is written in any unit of the user block thereof (will be updated each time data is written in the user block). Note that only one user block can be provided to the memory unit 24, and in this case, it can be said that only one sequence number SEQ exists as to the memory unit 24.

In the event that the memory unit 24 has the logical format in FIG. 8, in the same way as with the case in FIG. 3, the command sequencer unit 23 performs data writing control as to the memory unit 24. Specifically, for example, let us say that immediately before writing of data is performed (before writing), of the M+1 units #1 through #M+1 of the user block of interest, for example, the M+1'th unit #M+1 serves as a buffer unit, and the other first through M'th units #1 through #M serve as data units. Also, let us say that the unit number S_PAD of the data unit #m has a value m, and the sequence number SEQ (included in the control information) of the user block of interest has a value X.

Further now, for example, let us say that a write command for requesting data writing to a unit of which the unit number S_PAD (of the user block of interest) has a value has been transmitted from the reader/writer 10 to the wireless tag 20 along with data.

In this case, the command sequencer unit 23 writes, in accordance with the write command from the reader/writer 10, the data transmitted along with the write command thereof in the unit #M+1 serving as a buffer unit instead of an object unit that is a unit to be written, i.e., the unit #1 of which the unit number S_PAD has a value 1 (the unit having the unit number S_PAD where writing has been requested by the write command). Subsequently, the command sequencer unit 23 updates the control information of the user block of interest.

That is to say, as for the control information of the user block of interest, as described above, the latest control information (hereafter, also referred to as "newest control information"), and control information immediately before the latest control information thereof is written (hereafter, also referred to as "immediately preceding control information") are stored in the memory unit 24.

Now, let us say that, with the memory unit 24, control information C#t is stored as the newest control information of the user block of interest, and control information C#t−1 is stored as the immediately preceding control information of the user block of interest.

The command sequencer unit 23 takes the control information C#t as the control information of the updating source (hereafter, also referred to as "updating source control information"), and updates the updating source control information so that the unit number S_PAD of the unit #M+1 serving as a buffer unit is set to the same unit number S_PAD=1 as the unit number S_PAD=1 of the unit #1 that is the object unit, and the unit number S_PAD of the unit #1 serving as a new buffer unit is set to a value 0 representing that this unit is a buffer unit.

Further, the command sequencer unit 23 updates the sequence number SEQ included in the updating source control information, and calculates a new error detection code.

Subsequently, if we say that the updating source control information obtained as a result of the above is represented as control information C#t+1, the command sequencer unit 23 writes the control information C#t+1 in the control information C#t−1 that is the immediately preceding control information of the memory unit 24 as the control information of the user block of interest in an overwriting manner. As a result thereof, the control information C#t+1 serves as the newest control information of the user block of interest, and the control information C#t serves as the immediately preceding control information of the user block of interest.

Note that, in the event that the memory unit 24 has the logical format in FIG. 8, the command sequencer unit 23 performs the following processing in stead of steps S11 through S18 in FIG. 6 during the activation processing. Specifically, the command sequencer unit 23 uses the error detection code of the newest control information to perform error detection.

Subsequently, in the event that no error has been detected regarding the newest control information, the command sequencer unit 23 recognizes the buffer unit by referencing the newest control information, and erases all the pages (one page in FIG. 8) of the buffer unit, and sets to the erased state.

On the other hand, in the event that an error has been detected regarding the newest control information, the command sequencer unit 23 references the immediately preceding control information to recognize the buffer unit, erases all of the pages of the buffer unit, and set to the erased state.

As described above, the command sequencer unit 23 performs up to setting the buffer unit to the erased state during the activation processing. Subsequently, for example, upon a write command being transmitted from the reader/writer 10, the command sequencer unit 23 performs data writing control as to the memory unit 24 as described above.

However, in the event that an error has been detected regarding the newest control information, the command sequencer unit 23 performs updating with the immediately preceding control information as the updating source control information instead of the newest control information, and writes the updating source control information obtained as a result thereof in the newest control information in an overwriting manner.

Processing of Wireless Tag 20

Incidentally, in FIG. 6, the processing of the wireless tag 20 has been described assuming that a write command is transmitted to the wireless tag 20 only once, but a write command may be transmitted from the reader/writer 10 to the wireless tag 20 more than once. FIG. 9 is a flowchart for describing the processing of the wireless tag 20 in FIG. 2 in the event that a write command is transmitted from the reader/writer 10 to the wireless tag 20 once or more.

Now, let us say that the logical format of the memory unit 24 of the wireless tag 20 is the format illustrated in FIG. 3. With the wireless tag 20, in steps S41 through S50, the same processes in steps S11 through S20 in FIG. 6 are performed, respectively.

Subsequently, in step S50, upon the RF unit 22 receiving the write command from the reader/writer 10, and supplying to the command sequencer unit 23, the processing proceeds to step S51, where the command sequencer unit 23 determines whether or not all the pages of the buffer unit are in the erased state.

In the event that determination is made in step S51 that all the pages of the buffer unit are in the erased state, the processing skips step S52 and proceeds to step S53.

Also, in the event that determination is made in step S51 that one page or more of the buffer unit is not in the erased state, the processing proceeds to step S52, where the command sequencer unit 23 erases the buffer unit, and sets all the pages of the buffer unit to the erased state, and the processing proceeds to step S53.

Here, in step S52, erasing of the buffer unit may be performed with all of the pages of the buffer unit as an object, or may be performed with, of the pages of the buffer unit, just the pages not in the erased state as an object.

In steps S53 and S54, the same processes as steps S21 and S22 in FIG. 6 are performed, respectively.

After step S54, the processing returns to step S49, where the wireless tag 20 is in the command standby state to wait for the command from the reader/writer 10.

After awaiting the next write command to be transmitted from the reader/writer 10, the processing proceeds from step S49 to step S50, and hereafter, in the same way, the processing in steps S49 through S54 is repeated.

The processing in steps S49 through S54 ends, for example, in the event that power supply is prevented from receiving by the wireless tag 20 being separated from the reader/writer 10, or in the event that no command has been transmitted to the wireless tag 20 from the reader/writer 10 for a predetermined amount of time (the command standby state in step S49 has continued for a predetermined amount of time).

Note that embodiments of the present invention are not restricted to the above embodiments, and various modifications may be performed without departing from the essence of the present invention.

Specifically, for example, with the present embodiment, EEPROM has been employed as the memory unit 24 which is nonvolatile memory, but nonvolatile memory, for example, such as FeRAM (Ferroelectric Random Access Memory) or the like other than EEPROM may be employed as the memory unit 24. However, the writing processing of the separation method is particularly useful for nonvolatile memory having long electric charge accumulation time, for example, such as EEPROM.

Also, with the present embodiment, while one unit has been taken as a buffer unit, multiple units may be employed as buffer units.

It should be understood by those skilled in the art that various modifications, combinations, sub-combinations and alterations may occur depending on design requirements and other factors insofar as they are within the scope of the appended claims or the equivalents thereof.

What is claimed is:

1. A communication device comprising:
   communication means configured to perform proximity communication with a reader/writer; and
   control means configured to control writing of data as to nonvolatile memory in accordance with a command from said reader/writer;
   wherein a portion of the storage region of said nonvolatile memory is a user block that is a storage region equivalent to the minimum unit assigned to a service;
   and wherein said user block includes a plurality of units;

and wherein said units include one or more pages that are the storage regions of a predetermined unit where writing is performed;

and wherein at least one unit of a plurality of units making up said user block is a buffer unit that serves as a buffer to buffer data to be written in said user block;

and wherein said nonvolatile memory stores control information for controlling the storage region of said nonvolatile memory;

and wherein said control information includes a unit number for determining said units;

and wherein said control means write data in said buffer unit in accordance with a command from said reader/writer without performing processing to determine whether there is correspondence of said buffer unit to the unit number of an object unit that is a unit to be written with data and other than the at least one unit of the plurality of units that is a buffer unit when the command is received at the communication device, write the unit number of the object unit that is a unit to be written with data as the unit number of said buffer unit, and take said object unit as a new buffer unit of the plurality of units, thereby performing writing of data in said object unit;

and wherein said control means are activated by an RF signal being received from said reader/writer at said communication means.

2. The communication device according to claim 1, wherein said unit is made up of one page;

and wherein another portion of the storage region of said nonvolatile memory is a control block for storing control information for said every user block;

and wherein the control information of said user block includes the unit number of each of a plurality of units that the user block has, and one sequence number of which the value is regularly updated each time data is written in said nonvolatile memory.

3. The communication device according to claim 1, wherein said unit is made up of a plurality of pages;

and wherein one page of a plurality of pages that each unit of said units has is a control page that stores control information for said each unit;

and wherein the control information of said unit includes the unit number of the unit thereof, and one sequence number of which the value is regularly updated each time data is written in said nonvolatile memory.

4. The communication device according to claim 3, wherein said control means write data in said buffer unit in accordance with a command from said reader/writer, write the unit number of said object unit as the unit number of said buffer unit, and then erase said control page of said object unit, thereby taking said object unit as a new buffer unit.

5. The communication device according to claim 4, wherein said control means write data in a page other than the control page of said unit, and then write said unit number, said sequence number, and an error detection code for detecting an error of data written in said unit in said control page;

and wherein said control means recognize, in the event that there are units of the plurality of units having the same unit number, and of the units having the same unit number thereof, the error detection code of a unit having a newer sequence number is normal, said unit having a newer sequence number as the latest unit where the latest writing has been performed, and perform rewriting, in the control page of the latest unit thereof, of the stored content of the control page thereof.

6. The communication device according to claim 1, wherein said nonvolatile memory is EEPROM.

7. The communication device according to claim 1, wherein, after activation of the control means, the control means erase all of the pages of said buffer unit during activation processing to be performed before receiving a command from said reader/writer.

8. The communication device of claim 1, wherein the control means are activated to perform the proximity communication with the reader/writer by obtaining power serving as a power supply from the RF signal received from said reader/writer.

9. The communication device of claim 1, wherein the control means take said object unit as the new buffer unit after the unit number of the object unit that is a unit to be written with data is written as the unit number of said buffer unit.

10. A communication method for a communication device including communication means configured to perform proximity communication with a reader/writer, and control means configured to control writing of data as to nonvolatile memory in accordance with a command from said reader/writer, said method comprising the steps of:

taking a portion of the storage region of said nonvolatile memory as a user block that is a storage region equivalent to the minimum unit assigned to a service;

including a plurality of units in said user block;

including one or more pages that are the storage regions of a predetermined unit where writing is performed, in said units;

taking at least one unit of a plurality of units making up said user block as a buffer unit that serves as a buffer to buffer data to be written in said user block;

said nonvolatile memory storing control information for controlling the storage region of said nonvolatile memory;

including a unit number for determining said units, in said control information;

causing said control means to write data in said buffer unit in accordance with a command from said reader/writer without performing processing to determine whether there is correspondence of said buffer unit to the unit number of an object unit that is a unit to be written with data and other than the at least one unit of the plurality of units that is a buffer unit when the command is received at the communication device, to write the unit number of then object unit that is a unit to be written with data as the unit number of said buffer unit, and to take said object unit as a new buffer unit of the plurality of units, thereby performing writing of data in said object unit;

and activating said control means by an RF signal being received from said reader/writer at said communication means.

11. The communication method of claim 10, wherein the activating of said control means by the RF signal is to erase all of the pages of said buffer unit during activation processing to be performed before receiving a command from said reader/writer.

12. A communication device comprising:

circuitry configured to perform proximity communication with a reader/writer and to control writing of data as to nonvolatile memory in accordance with a command from said reader/writer;

wherein a portion of the storage region of said nonvolatile memory is a user block that is a storage region equivalent to the minimum unit assigned to a service;

and wherein said user block includes a plurality of units;

and wherein said units include one or more pages that are the storage regions of a predetermined unit where writing is performed;

and wherein at least one unit of a plurality of units making up said user block is a buffer unit that serves as a buffer to buffer data to be written in said user block;

and wherein said nonvolatile memory stores control information for controlling the storage region of said nonvolatile memory;

and wherein said control information includes a unit number for determining said units;

and wherein said circuitry writes data in said buffer unit in accordance with a command from said reader/writer without performing processing to determine whether there is correspondence of said buffer unit to the unit number of an object unit that is a unit to be written with data and other than the at least one unit of the plurality of units that is a buffer unit when the command is received at the communication device, writes the unit number of the object unit that is a unit to be written with data as the unit number of said buffer unit, and takes said object unit as a new buffer unit of the plurality of units, thereby performing writing of data in said object unit;

and wherein said circuitry is activated by an RF signal being received from said reader/writer at said circuitry.

13. The communication device according to claim 12, wherein, after activation of the circuitry, the circuitry erases all of the pages of said buffer unit during activation processing to be performed before receiving a command from said reader/writer.

14. A communication method for a communication device including circuitry configured to perform proximity communication with a reader/writer, and to control writing of data as to nonvolatile memory in accordance with a command from said reader/writer, said method comprising the steps of:

taking a portion of the storage region of said nonvolatile memory as a user block that is a storage region equivalent to the minimum unit assigned to a service;

including a plurality of units in said user block;

including one or more pages that are the storage regions of a predetermined unit where writing is performed, in said units;

taking at least one unit of a plurality of units making up said user block as a buffer unit that serves as a buffer to buffer data to be written in said user block;

said nonvolatile memory storing control information for controlling the storage region of said nonvolatile memory;

including a unit number for determining said units, in said control information;

causing said circuitry to write data in said buffer unit in accordance with a command from said reader/writer without performing processing to determine whether there is correspondence of said buffer unit to the unit number of an object unit that is a unit to be written with data and other than the at least one unit of the plurality of units that is a buffer unit when the command is received at the communication device, to write the unit number of the object unit that is a unit to be written with data as the unit number of said buffer unit, and to take said object unit as a new buffer unit of the plurality of units, thereby performing writing of data in said object unit;

and activating said circuitry by an RF signal being received from said reader/writer at said circuitry.

15. The communication method of claim 14, wherein the activating of said circuitry by the RF signal is to erase all of the pages of said buffer unit during activation processing to be performed before receiving a command from said reader/writer.

* * * * *